United States Patent [19]
Lu et al.

[11] Patent Number: 6,113,411
[45] Date of Patent: Sep. 5, 2000

[54] CONTACT FOR A SOCKET

[75] Inventors: Sidney Lu, Taipei; Shih-Wei Hsiao, Kaohsiung; Yao-Chi Huang, Yung-Ho, all of Taiwan

[73] Assignee: Hon Hai Precision Ind. Co., Ltd., Taipei Hsien, Taiwan

[21] Appl. No.: 09/329,902

[22] Filed: Jun. 10, 1999

[30] Foreign Application Priority Data

Mar. 19, 1999 [TW] Taiwan ................................ 88204176

[51] Int. Cl.[7] ...................................................... H01R 4/50
[52] U.S. Cl. ........................................... 439/342; 439/259
[58] Field of Search ........................... 439/342, 259–268, 439/856, 857

[56] References Cited

U.S. PATENT DOCUMENTS

| | | | |
|---|---|---|---|
| 3,676,832 | 7/1972 | Judge et al. | 439/342 |
| 4,498,725 | 2/1985 | Bright et al. | 439/342 |
| 5,299,950 | 4/1994 | Kaneko | 439/342 |
| 5,658,160 | 8/1997 | Lai | 439/342 |

*Primary Examiner*—Hien Vu
*Attorney, Agent, or Firm*—Wei Te Chung

[57] ABSTRACT

A contact used in a socket for electrically connecting with a pin of a CPU, comprises a fixing portion for being fixed in the socket, a mating portion and a connecting portion connected between the fixing portion and the mating portion. The mating portion has a receiving body which forms a receiving space adapted for entrance of the pin of the CPU to be in a first position, and has two engaging body extending from the receiving CPU for sidewardly gripping the pin of the CPU therebetween when the pin of the CPU is moved from the first position to a second position. The connecting portion is capable of deforming to effectuate a limited turning movement of the mating portion relative to the fixing portion about the connecting portion in response to a sideward displacement of the pin of the CPU from the second position.

4 Claims, 7 Drawing Sheets

CONTACT FOR A SOCKET

BACKGROUND OF THE INVENTION

1. Field of the Invention

The present invention relates to a contact used in a socket, and especially to a contact of a ZIF socket.

2. Description of Prior Art

As computer functions continue to expand, a Central Processing Unit (CPU) requires an increasing number of memory processing units, thus transmission paths become more compact and complex. Therefore, securely and stably connecting the chipset to a circuit board for ensuring accurate signal transmission is very important. A socket for connecting a CPU of a computer related to the present invention is disclosed in the U.S. Pat. Nos. 3,676,832; 4,498,725; and 4,988,310.

Referring to FIGS. 1A, 1B, 2A and 2B, a socket 6 for connecting a CPU (not shown) to a circuit board (not shown) with zero insertion force generally includes a dielectric base 601, a plurality of contacts 60 (only one shown) received in the dielectric base 601 and a cover 602 covering the dielectric base 601 and supporting the CPU. The cover 602 together with the CPU, is movable relative to the dielectric base 601 whereby pins (only one shown) 7 of the CPU electrically connect with the contacts 60 of the socket 6.

The contacts 60 of the socket 6 each comprise a terminal portion 61 for electrically connecting with the circuit board and a mating portion 62 integrally extending from the terminal portion 61. The mating portion 62 symmetrically defines a pair of spring arms extending from opposite sides thereof. Receiving portions 621 are formed on the spring arms for receiving the pin 7 of the CPU. The distance between the two receiving portions 621 is larger than the diameter of the pin 7 whereby the pin 7 is received between the receiving portions 621 without any contact therebetween for implementing zero insertion force. Engaging portions 622 extend from the receiving portions 621. The distance between the engaging portions 622 is smaller than the diameter of the pin 7 of the CPU. Thus, the pin 7 is secured therebetween to implement electrical connection when the CPU is moved to an engaged position. However, when the pin 7 of the CPU is not located at a predetermined position, improper connection with the engaging potions 622 of the contact 60 results. Thus, the contacts 60 of the socket can not ensure properly mating with the pins 7 of the CPU. In addition, since the spring arms and the pin 7 define a shunt-wound electrical connection, a contact resistance bulk of the symmetrical spring arms is large relative to non-symmetrical spring arms. Thus, the contact resistance bulk of the mating portion 62 is large.

SUMMARY OF THE INVENTION

Accordingly, an object of the present invention is to provide a contact of a ZIF socket having a connecting portion for self-adjusting the position of a mating portion thereof to ensure proper connection of the contact with a pin of a CPU.

Another object of the present invention is to provide a contact of a ZIF socket having different lengths from a connecting portion to distal ends of mating portion for reducing a resistance of the mating portion.

In a preferred embodiment of the present invention, a contact used in a socket for electrically connecting with a pin of a CPU, comprises a fixing portion for being fixed in the socket, a mating portion and a connecting portion between the fixing portion and the mating portion. The mating portion has a receiving body which forms a receiving space adapted for entrance of the pin of the CPU to be in a first position, and has two engaging body extending from the receiving body for sidewardly gripping the pin of the CPU therebetween when the pin of the CPU is moved from the first position to a second position. The connecting portion is capable of deforming to effectuate a limited turning movement of the mating portion relative to the fixing portion about the connecting portion in response to a sideward displacement of the pin of the CPU from the second position.

BRIEF DESCRIPTION OF THE DRAWINGS

Other objects and advantages of the present invention will be understood from the following description of a socket according to a preferred embodiment of the present invention shown in the accompanying drawings, in which.

DETAILED DESCRIPTION OF THE PREFERRED EMBODIMENT

Figure 1A:
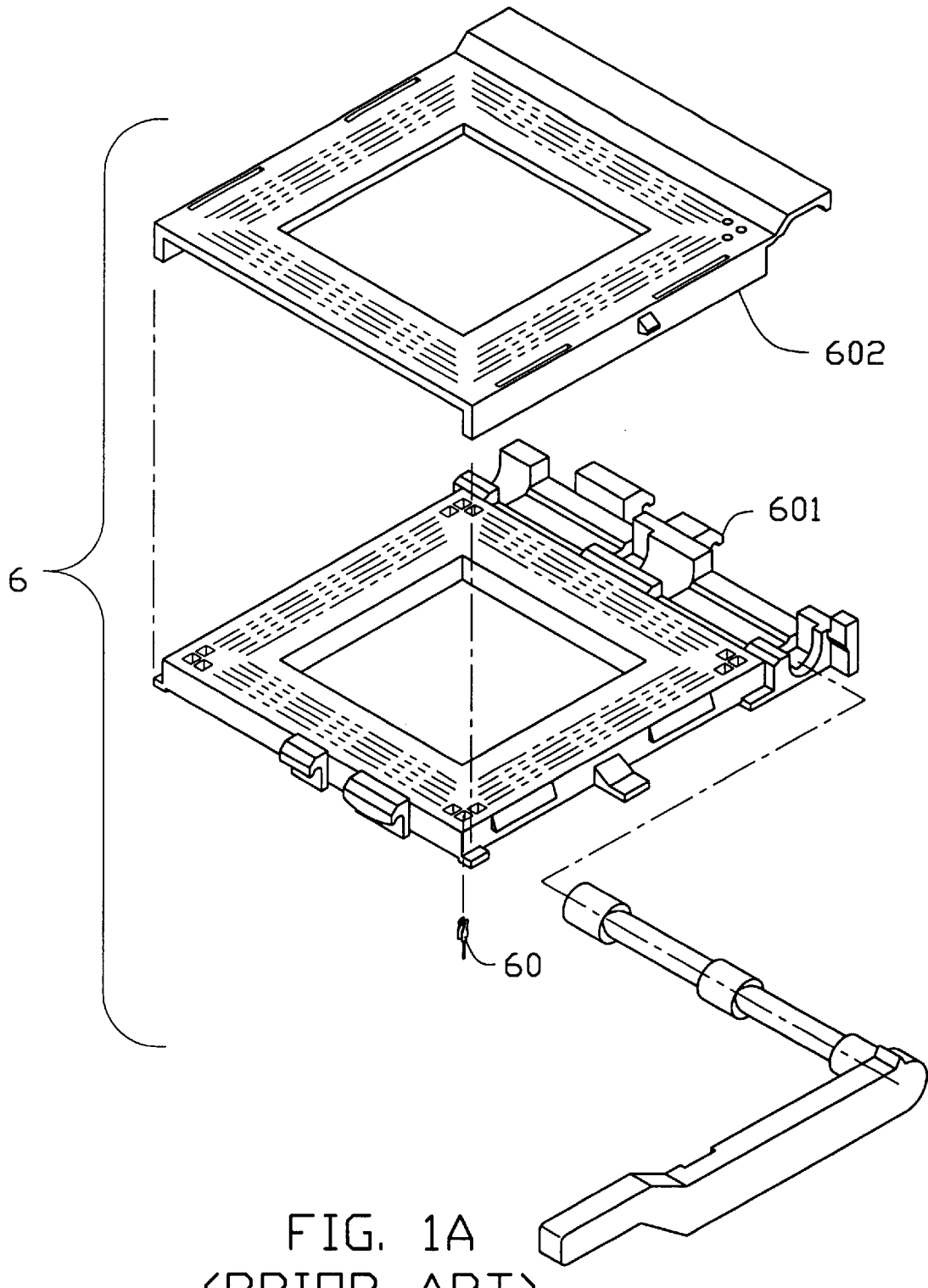
FIG. 1A is an exploded view of a traditional socket.
Figure 1B:
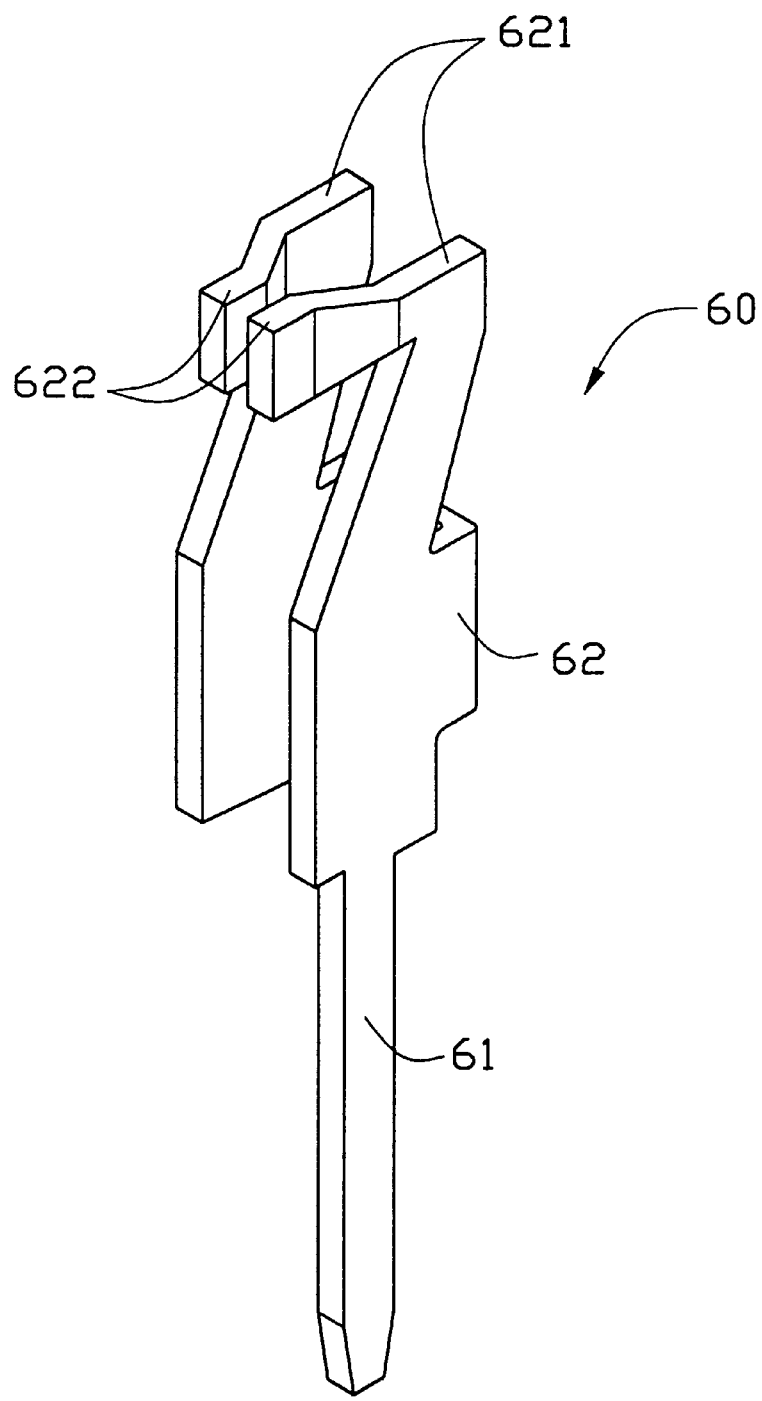
FIG. 1B is an enlarged perspective view of a contact of FIG. A.
Figure 2B:
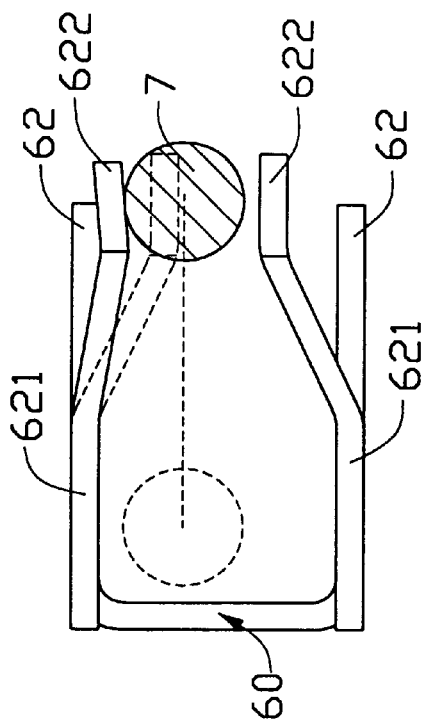
FIG. 2B is similar to FIG. 2A showing a pin of another CPU mating with the contact.
Figure 2A:
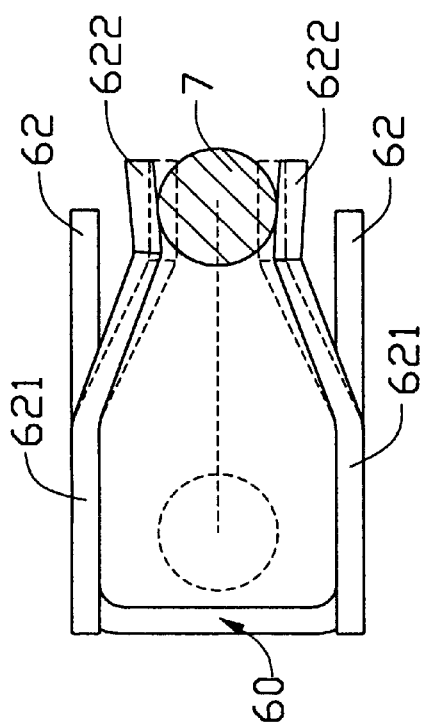
FIG. 2A is a top plane view showing a pin of a CPU mating with the contact of FIG. 1B.
Figure 3A:
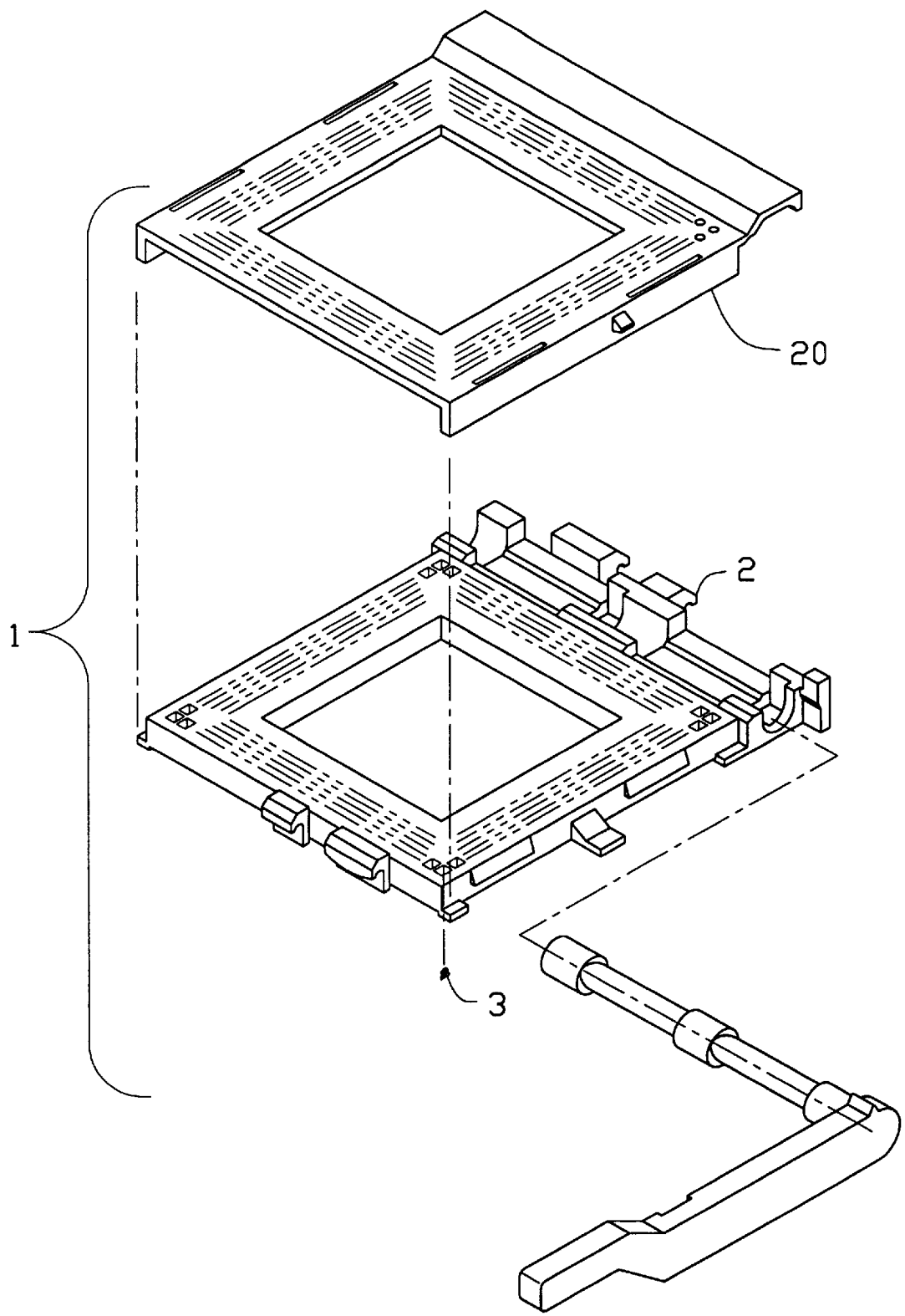
FIG. 3A is an exploded view of a socket embodying concepts of the present invention.
Figure 3B:
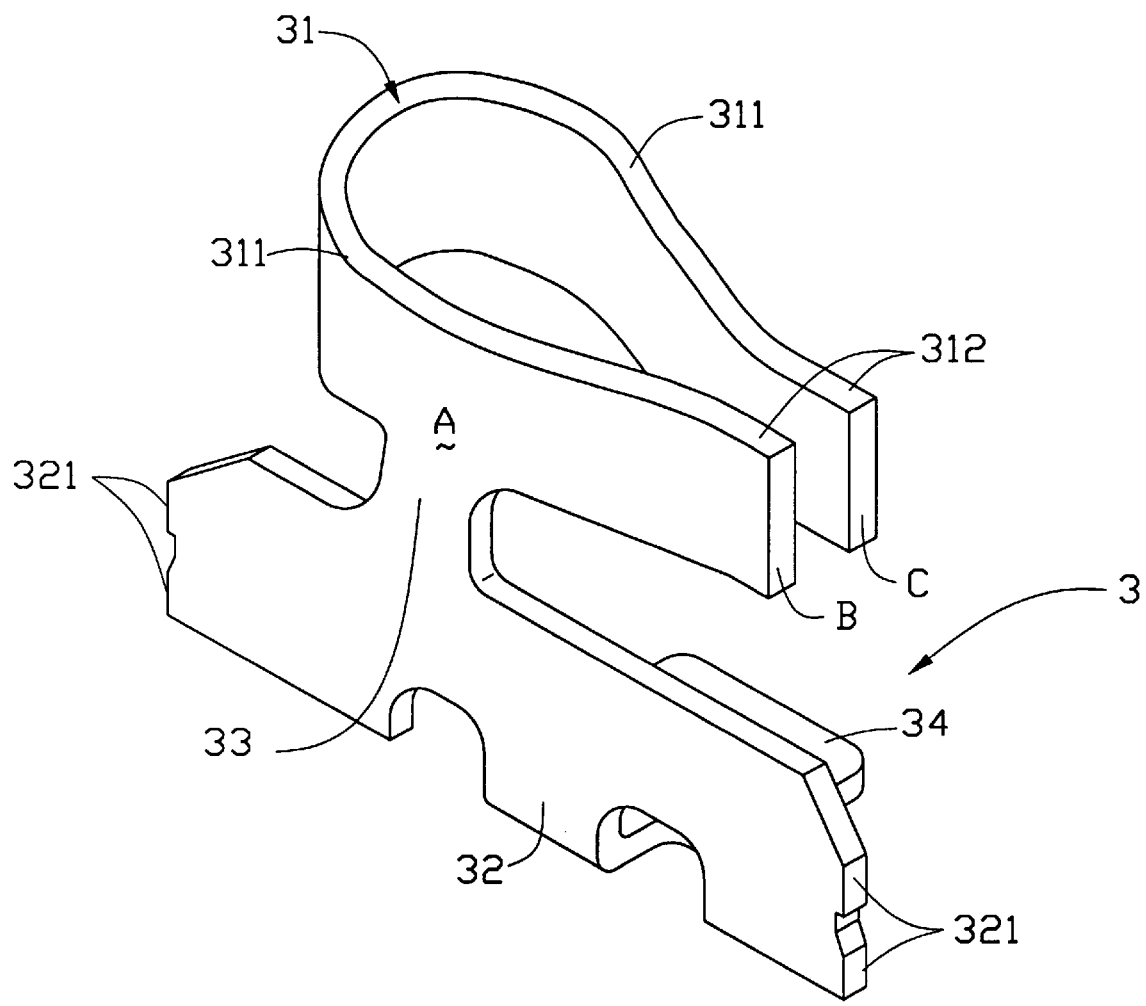
FIG. 3B is an enlarged perspective view of a contact shown in FIG. 3A.
Figure 4:
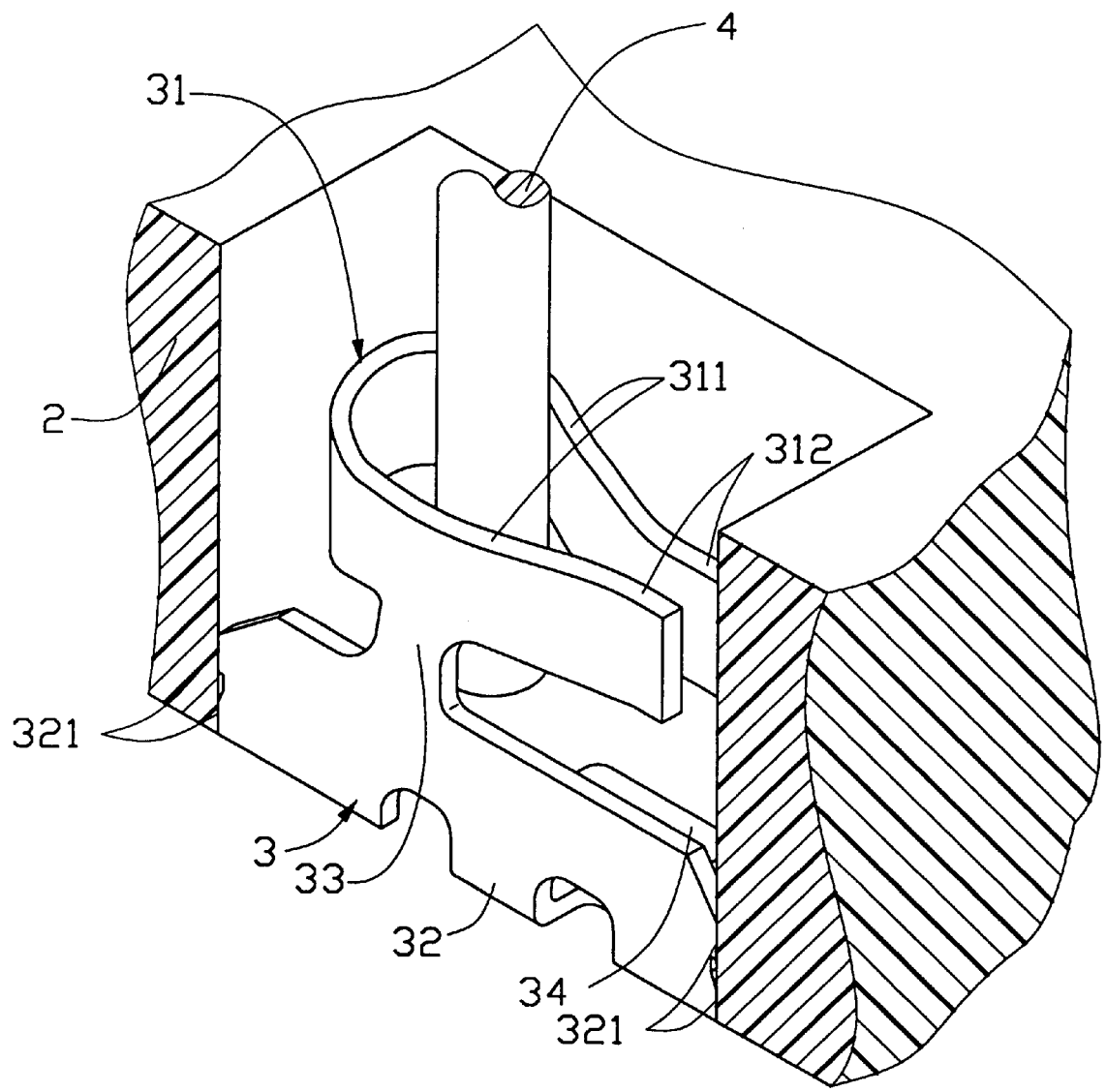
FIG. 4 is a fragmented, assembled view of FIG. 3A, with a pin of a CPU inserted into the contact.

Referring to FIGS. 3A, 3B and 4, a socket 1 for mating with a CPU (not shown) comprising a plurality of pins 4 includes a dielectric base 2, a cover 20 covering the dielectric base 2 and a plurality of contacts 3 respectively received in cavities 22 of the dielectric base 2 for electrically connecting with the pins 4 of the CPU.

Each contact 3 comprises a mating portion 31, a fixing portion 32 and a connecting portion 33 between the mating portion 31 and the fixing portion 32. The mating portion 31 has a generally C-shaped receiving body 311 which forms a receiving space adapted for entrance of the pin 4 of the CPU to situate the pin 4 at a first position without any contact to the receiving body 311 for implementing zero insertion force. Engaging body 312 extend from opposite ends of the receiving body 311 and converge toward each other adapted for sidewardly gripping the pin 4 of the CPU situated at a second position defined between the engaging arms 312. Thus the contact 3 implements electrical connection with the pin 4 when the pin 4 of the CPU is moved from the first position to a second position. The connecting portions 33 is a narrow thin piece connected with an end A of the receiving body 311. The connecting portion 33 is capable of deforming to effectuate a limited turning movement of the mating portion 31 relative to the fixing portion 32 about the connecting portion 33 in response to a sideward displacement of the pin 4 of the CPU from the second position. That's, the connecting portion is so dimensioned as to effectuate a torsion while sideward gripping forces applied by the two engaging body to the pin of the CPU are substantially unequal. Lengths along the mating portion 31 respectively measured from free ends B, C of the two engaging body 312 to the end A of the receiving body 311 connected to the connecting portion 33 are different thereby reducing a contact resistance bulk between the mating portion 31 and the connecting portion 33.

The fixing portion 32 is elongate with a plurality of protrusions 321 formed on opposite edges thereof for interferentially engaging with the dielectric base 2 thereby securely fixing the contact 3 therein. The contact 3 further includes a terminating portion 34 perpendicularly extending from one edge of the fixing portion 32 for connecting to a circuit board.

Figure 5:
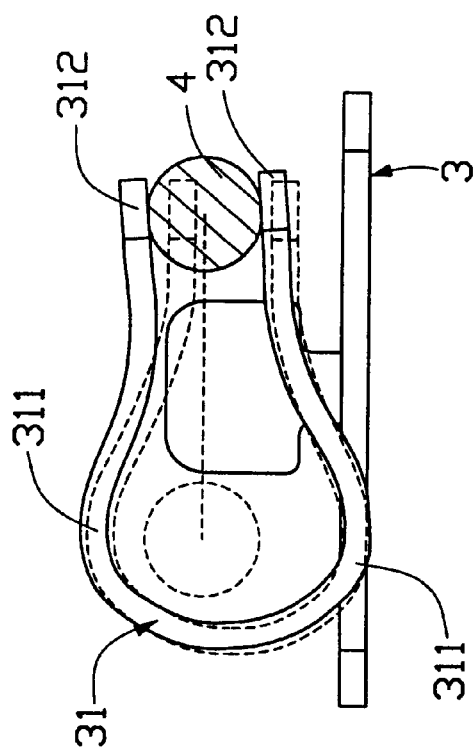
FIG. 5 is a top plane view of FIG. 4 with the dielectric base not shown, showing the pin of the CPU moved to a predetermined position mating with the contact.

Referring to FIG. 5, when the CPU is assembled to the ZIF socket, the pin 4 of the CPU is normally received in the receiving portion 311 of the mating portion 31 at the predetermined first position, and then moved to the predetermined second position to be secured between the engaging body 312.

Figure 6:
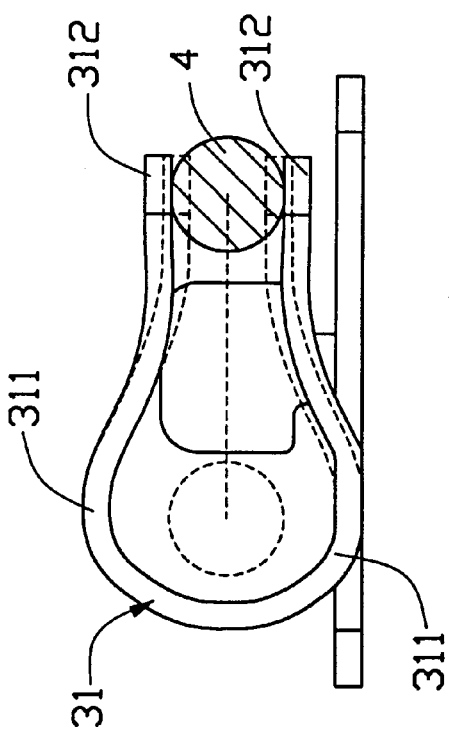
FIG. 6 is a view similar to FIG. 5 but showing a pin of another CPU not received at the predetermined position mating with the contact.

Referring to FIG. 6, if the pin 4 is not received at the predetermined first position, associated with the receiving body 311 when the pin 4 is moved to the engaging arms 312, of the mating portion 31 and situated out of the predetermined second position the connecting portion 33 (see FIG. 4) will effectuate a torsion for properly aligning the engaging arms 312 of the contact 3 with the pin 4 since the connecting portion 33 is so narrow and thin as to be readily deformed. Both engaging arms 312 engage with the pin 4 situated out of position as the pin 4 situated at predetermined second position. Thus, the connection between the contact 3 and the pin 4 of the CPU is secure and reliable.

It will be understood that the present invention may be embodied in other specific forms without departing from the spirit of the central characteristics thereof. The present example and embodiment, therefore, is to be considered in all respects as illustrative and not restrictive, and the invention is not to be limited to the details given herein.

What is claimed is:

1. A contact used in a socket for electrically connecting with a pin of a chipset, comprising:

a fixing portion having protrusions for being fixed in the socket;

a connecting portion extending from the fixing portion; and a C-shaped mating portion connected with the connecting portion, the mating portion having a receiving body which forms a receiving space adapted for entrance of the pin of the chipset to to be in said body at a first position and having two engaging arms extending from opposite ends of the receiving portion adapted for sidewardly gripping the pin situated at a second position associated with the engaging arms, the pin electrically connecting with the mating portion when the pin of the chipset is moved from the first position to the second position, said connecting portion being connected with one of said two engaging arms, and in between the fixing portion and the mating portion; wherein the connecting portion is capable of deforming to effectuate a limited turning movement of the mating portion relative to the fixing portion about the connecting portion in response to a sideward displacement of the pin of the chipset from the second position.

2. A socket for electrically connecting with a chipset comprising:

a dielectric base;

a cover covering the dielectric base, and a plurality of contacts received in the dielectric base for mating with pins of the chipset, each contact comprising:

a fixing portion having protrusions for being fixed in the socket;

a C-shaped mating portion having a receiving body which forms a receiving space adapted for entrance of the pin of the chis to be in said receiving body at a first position associated with the receiving body, and having two engaging arms extending from the receiving body for sidewardly gripping the pin situated at a second position associated with the engaging arms, the pin electrically connecting with the mating portion when the pin of the chipset is moved from the first position to the second position; and a connecting portion connected with one of said two arms and in between the fixing portion and the mating portion, the connecting portion being capable of deforming to effectuate a limited turning movement of the mating portion relative to the fixing portion about the connecting portion in response to a sideward displacement of the pin of the chipset from the second position, individual lengths along the mating portion respectively measured from free ends of the two engaging arms to a portion of the receiving body connected to the connecting portion being different thereby reducing a contact resistance between the mating portion and the connecting portion.

3. The socket as described in claim 2, wherein the connecting portion is a narrow thin piece.

4. A socket for electrically connecting with a chipset, comprising:

a dielectric base defining a plurality of cavities;

a plurality of contacts respectively received within the corresponding cavities in the socket for electrically connecting with a pin of a chipset, each of said contacts comprising:

a planar fixing portion having protrusions for being fixed in the cavity of the socket;

a generally C-shaped mating portion having a receiving body which forms a receiving space adapted for entrance of the pin of the chipset to be in aid at a first position associated with the receiving body, and having two engaging arms extending from the receiving body for sidewardly gripping the pin situated at a second position associated with the engaging arms, the pin electrically connecting with the mating portion when the pin of the chipset is moved from the first position to the second position; and a planar connecting portion being connected with one of said two engaging arms and in between the fixing portion and the mating portion; wherein the connecting portion, the fixing portion and two engaging arms commonly extend generally along a longitudinal direction of the corresponding cavity which is same as a moving direction of the pin of the chipset.

* * * * *